United States Patent [19]
Boyd et al.

[11] 4,309,267
[45] Jan. 5, 1982

[54] REACTIVE SPUTTER ETCHING APPARATUS

[75] Inventors: Gary D. Boyd, Rumson; Larry A. Coldren, Holmdel; Frederick G. Storz, Englishtown, all of N.J.

[73] Assignee: Bell Telephone Laboratories, Incorporated, Murray Hill, N.J.

[21] Appl. No.: 170,586

[22] Filed: Jul. 21, 1980

[51] Int. Cl.³ .............................................. C23C 15/00
[52] U.S. Cl. ................................. 204/298; 204/192 E
[58] Field of Search .......................... 204/192 E, 298; 156/345, 643

[56] References Cited

U.S. PATENT DOCUMENTS

| | | | |
|---|---|---|---|
| 3,526,584 | 9/1970 | Shaw | 204/192 R |
| 3,730,873 | 5/1973 | Pompei et al. | 204/298 |
| 3,943,047 | 3/1976 | Cruzan et al. | 204/192 E |
| 4,131,506 | 12/1976 | Namba et al. | 156/643 |

FOREIGN PATENT DOCUMENTS 1214675  12/1970  United Kingdom ............ 204/192 E

OTHER PUBLICATIONS

Y. Budo et al., "Multiusage of Sputter & Sputter Etch", *IBM Tech. Discl. Bull.*, vol. 15, p. 1695 (1972).
S. Somekh, "Introduction to Ion & Plasma Etching", *J. Vac. Sci. Tech.*, vol. 13, pp. 1003–1007 (1976).
S. Somekh et al., "Dry Processing of High Resolution & High Aspect Ratio Structures Inc GaAs-$Al_xGa_{1-x}$ As For Integrated Optics", *Applied Optics*, vol. 16, pp. 126–136, (1977).
H. W. Lehmann et al., "Profile Control by Reactive Sputter Etching", *J. Vac. Sci. Tech.*, vol. 15, pp. 319–326 (1978).
G. D. Boyd et al., "Directional Reactive Ion Etching at Oblique Angles", *Appl. Phys. Lett.*, vol. 36, pp. 583–585 (1980).

*Primary Examiner*—Aaron Weisstuch
*Attorney, Agent, or Firm*—Daniel D. Dubosky

[57] ABSTRACT

An rf sputter etch or reactive sputter etch apparatus which can be used for etching substrates at oblique angles utilizes a cathode formed from a metal grid and an equipotential enclosure. The substrate is supported in the enclosure either parallel to or at an oblique angle to the surface of the grid.

5 Claims, 4 Drawing Figures

REACTIVE SPUTTER ETCHING APPARATUS

BACKGROUND OF THE INVENTION

The present invention pertains to the field of reactive ion etching.

The etching of SiO2 has been performed by use of many different processes including ion milling, sputter etching, plasma etching and reactive ion etching.

Ion milling or ion etching is a process in which substrate atoms are removed by bombardment with an ion stream. Etching results from the transfer of momentum from the incident ions to the target atoms on the substrate. The ion stream in an ion mill is produced by a gas plasma, usually argon, which can be either rf or dc excited. The plasma is isolated from the milling chamber by a sequence of grids. The ions are focused and accelerated toward the target by the negatively biased grid network. Because the target is isolated from the plasma and the concomitant electron and hot atom bombardment, the target temperatures can be minimized by water cooling. Some advantages of an ion mill are; the etching is highly directional, photoresist can be used as a mask material for pattern delineation and the substrate can be tilted to etch at an angle. Some disadvantages of ion milling are: low etch rate because the sputtering process is limited by the ion beam current, sputter depths are limited due to poor selectivity between the etch rate of the mask and substrate materials, maximum etch depth is limited to approximately the mask thickness due to redeposition of material in the etched area when the etch depth exceeds the etched width, and trenching along the etch walls. Trenching and redeposition are particularly apparent when thick masks are used.

Rf sputter etching is a process in which substrate atoms are removed by bombardment with gas ions of an inert gas. Rf sputter etching is performed in a vacuum chamber containing parallel plates, across which plates rf power is capacitively coupled. The substrate is placed upon the cathode and the other plate, the anode, is grounded. The chamber is first evacuated and then backfilled to a pressure of about ~10 millitorr. Typically, the inert gas used is argon. When the rf power is applied to the plates a gas plasma is formed and a negative bias is generated at the cathode surface because the electrons have a greater mobility than the ions in the plasma. A "no-glow" region called the dark space is formed near the cathode. This dark space typically occupies a third of the distance between the anode and cathode and has a high field. The ions in the plasma are accelerated across the dark space toward the cathode and the substrate placed thereon. The etching is directional (i.e. anisotropic) because the electric field in the dark space controls the direction of acceleration of the ions and the electric field therein is perpendicular to the cathode because of the parallel nature of the plates. Rf sputter etching usually requires the use of metal masks for pattern delineation because of the proximity of the hot plasma to the substrate. The power dissipated by the electron current provides heat, which heat prohibits the use of photoresist as a mask material. As with ion milling, sputter etch selectivity is small and this limits the etch depth. Although redeposition and trenching are difficult to prevent when large etched depths are required, the system is simpler and more easily maintained than an ion beam milling system.

Plasma etching is a process in which the substrate is exposed to a chemically reactive ionized or excited gas mixture. There is no high voltage to provide ion acceleration. The substrate is exposed to a reactive gas plasma which has been produced by either rf or dc voltages. The substrates in a typical plasma etching system are placed at the anode potential and high gas pressures of the order of 100 $\mu$m are used. The plasma etching process involves low temperatures because the power required to generate the plasma is low. The low temperature permits the use of photoresist as a mask material in most situations. Because plasma etching is a chemical process rather than an ion bombardment process, etch selectivity between mask and substrate materials is high. Very deep etching can be provided with minimal mask erosion. However, unlike the ion milling and sputter etching processes described hereinabove, plasma etching tends to be an isotropic process. This isotropy causes undercutting and makes retention of pattern profiles difficult to control. One advantage, however, is that redeposition of substrate material is eliminated with plasma etching because the products of the chemical reactions are volatile and are withdrawn from the etch chamber.

Reactive sputter etching (sometimes called reactive ion etching), like plasma etching, is primarily a chemical etching process. The process is generally carried out in a standard rf sputtering station at low rf power, $\leq 0.3$ W/cm$^2$. Like sputter etching, with gas pressures in the range of 1 to 30 $\mu$m, the substrates are placed on the cathode. The etching process is thought to be a combination of chemical reaction and ion bombardment. However, neither the relative combination of each nor the nature of the reactive species actually responsible for the etching is fully understood at present. Since reactive sputter etching is a combination of chemical and sputter etching processes, it combines some desirable features of both processes. The predominantly chemical nature of the process is responsible for high etch rates and etch selectivity. It uses a lower power than sputter etching and therefore is a lower temperature process. Undercutting, which is a large problem in plasma etching, is eliminated with reactive ion etching because of the highly directional ion acceleration across the dark space normal to the target, which effect is characteristic of low pressure ion sputtering processes. Furthermore, due to the volatility of the chemical reaction products redeposition is also eliminated.

In some cases, it is desirable to reactive sputter or rf sputter etch at oblique angles relative to the substrate normal, as is possible in conventional ion beam etching configurations. In the parallel-plate rf sputter etch geometry, if the substrates are merely angled away from the cathode, the electric field lines, and therefore, the ion trajectories, tend to be approximately normal to the surface. If the cathode surface were tilted, or if portions of it were to protrude above the line of the cathode to distort the parallel plasma geometry, the electric field lines tend to remain perpendicular to the entire cathode surface unless the substrate were sufficiently small so as not to disturb the parallel geometry.

SUMMARY OF THE INVENTION

An apparatus suitable for rf sputter and reactive sputter etching a substrate at either normal incidence or at an oblique angle to the substrate surface in a parallel plate sputter etch geometry utilizes an equipotential cathode comprising a metal grid and an equipotential enclosure. The substrate to be etched is supported in the enclosure either parallel to or at an oblique angle to the grid. The grid is tied to the cathode potential so that a planar dark space is formed between it and a gas plasma.

BRIEF DESCRIPTION OF THE DRAWINGS

A complete understanding of the present invention may be gained from a consideration of the detailed description presented hereinbelow in connection with the accompanying drawings in which.

DETAILED DESCRIPTION

Figure 1:
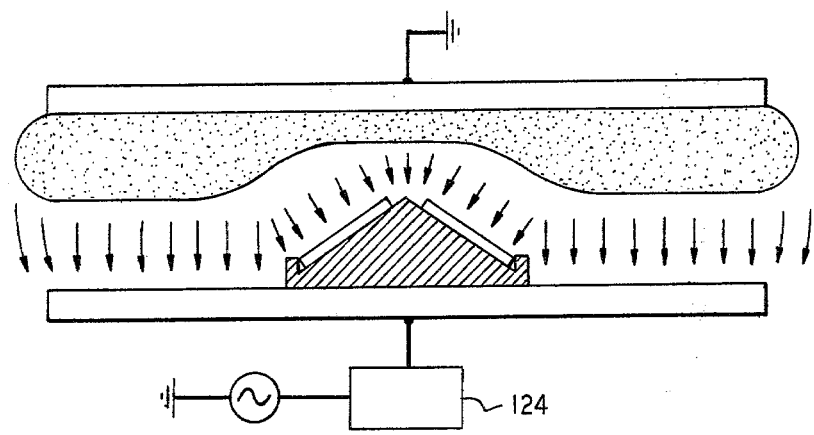
FIG. 1 presents, in pictorial form, the electric field lines resulting from placement of a substrate at an oblique angle to the cathode in a conventional sputter etch station.

When reactive sputter etching is performed in a conventional parallel plate geometry, rf sputter etch system, a plasma is formed between the parallel plates. In such a system, the electrode to which the rf power is applied charges to a negative potential (becoming the "cathode") and a dark space is formed near this cathode electrode. Ions in the plasma are accelerated across the dark space toward the cathode by the negative potential. This acceleration of positive ions across the dark space follows the direction of the electric field lines. In the conventional parallel plate geometry, the ions bombard the cathode surface and the substrate placed thereon at normal incidence. If the cathode surface were tilted or if portions of it protruded above the parallel plate of the cathode in order to provide directional reactive ion etching at oblique angles in such a manner as to distort the anode to cathode parallel geometry, the electric field lines would be distorted so that they remained perpendicular to the cathode surface. This would once again, as in the parallel-plate geometry, produce ion bombardment at normal incidence to the surface of the substrate. This is illustrated in FIG. 1 which shows the electric field lines in the dark space produced by positioning a substrate at an angle to the cathode surface.

Figure 2:
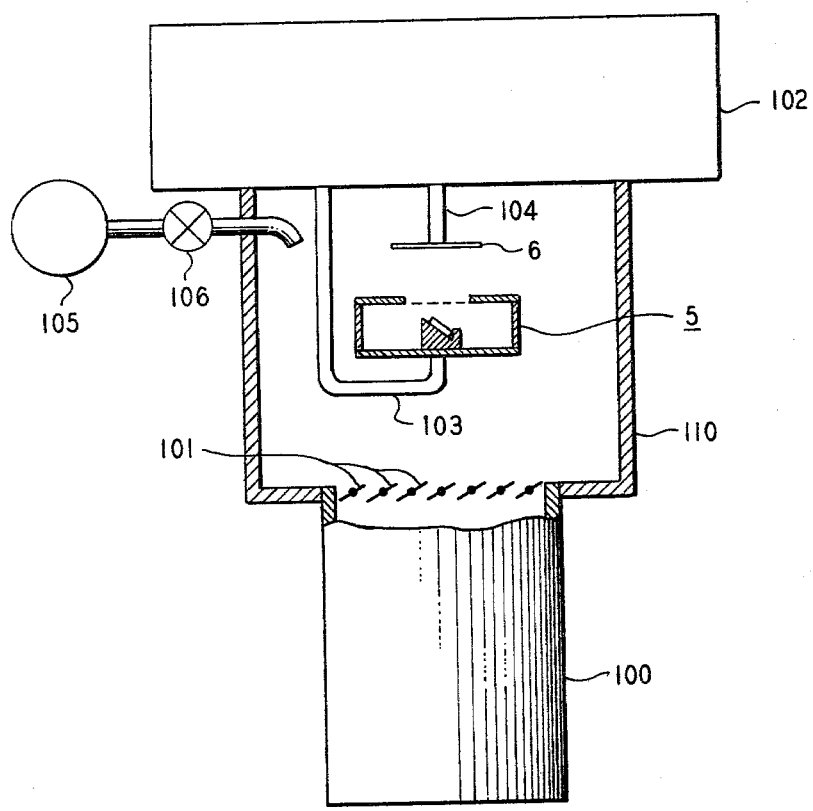
FIG. 2 presents, in pictorial form, an embodiment of the present invention utilized to etch a fused-silica substrate.

FIG. 2 shows an embodiment of the present invention which achieves directional etching at oblique angles. The reactive sputter etch system has a vacuum pump 100 and baffle 101 for increasing the pressure in chamber 110. Typically vacuum pump 100 is a diffusion pump. Support 104 holds anode 6 and support 103 holds cathode structure 5 within chamber 110. Gas supply 105 is connected to gas valve 106 so that gaseous etch materials may enter chamber 110. Rf signal source 102 applies an rf voltage across the anode and the cathode in order for the etch process to proceed. An electrical tuning circuit 124, contained in source 102, is generally included to reduce reflected power from the chamber.

Figure 3:
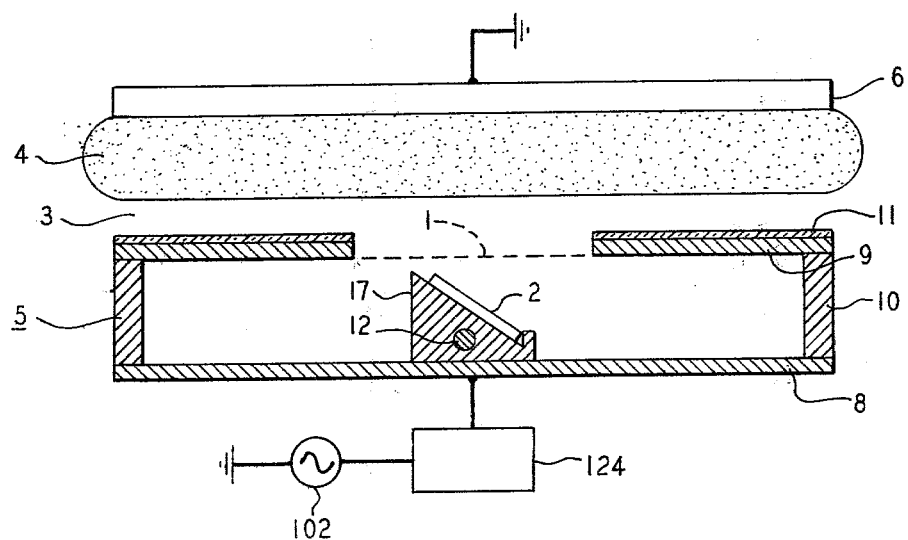
FIG. 3 presents, in pictorial form, the electrode structure of an embodiment of the present invention.

FIG. 3 shows a detailed aspect of the embodiment of the present invention which illustrates the electrode structure. Grid 1, which grid is tied to the cathode potential, is placed in front of angled substrate 2 so that a planar dark space 3 is formed between grid 1 and plasma 4 when an rf signal generated by voltage source 102 is impressed across anode 6 and cathode structure 5.

Substrate 2 is placed on mounting platform 17 in cathode structure 5. Cathode structure 5 comprises plate 9, having an aperture; grid 1 placed in the aperture in plate 9; plate 8 and wall 10. Plates 8 and 9 along with wall 10 form a box. The box, along with grid 1, is tied to the cathode potential to form an equipotential enclosure. The purpose of the box is to remove substrate 2 from the region between anode 6 and grid 1 to eliminate any effect the substrate might produce on the plasma. Thus, grid 1 forms a portion of the top surface of an equipotential cathode enclosure which is placed over the substrate, as shown in FIG. 3, to eliminate any distorting fields or plasma within the box. Ions in plasma 4 are accelerated across dark space 3, pass through grid 1 at normal incidence, and drift unimpeded toward angled substrate 2 to provide etching. The choice of grid material and the specific configuration of the grid may be important for a given set of operating conditions such as the type of gas etchant, the gas pressure and the applied rf power.

We have used the embodiment shown in FIG. 2 to etch fused-silica with $CHF_3$ in a configuration where plates 8 and 9 were two stainless steel plates. The stainless steel plates were held together with steel spacers. Wall 10 was a solid stainless steel ring. Top plate 9 has a 2" square hole covered by grid 1. All exposed stainless steel surfaces were covered with $SiO_2$ layer 11 except for the 2" grid area. $SiO_2$ layer 11 prevents the sputtering of stainless steel during the process. During etching the entire fixture rests at cathode potential. The cathode diameter is 15.2 cm, the box height (distance between plates 8 and 9) is 2.6 cm, the distance between plate 9 and anode 6 is 2.6 cm, the grid pitch is 2 mm and the grid wire diameter is 250 $\mu$m.

Figure 4:
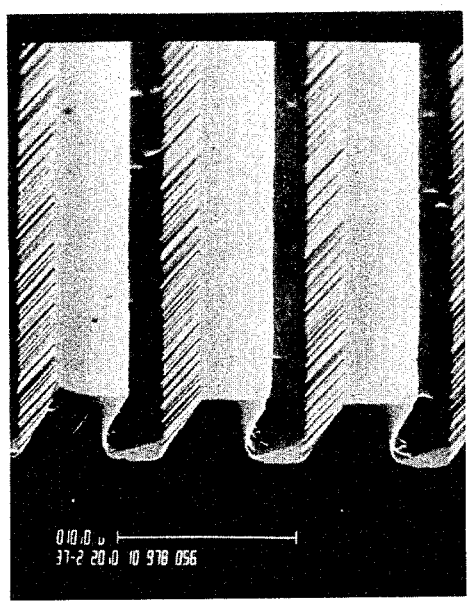
FIG. 4 presents an angle-etched substrate produced by the embodiment shown in FIG. 2.

Cathode structure 5 was mounted in a Perkin-Elmer rf diode sputtering attachment on a Veeco oil diffusion pump station. The Veeco station was modified to include a throttle valve in the throat of the diffusion pump. The jar pressure was monitored with a capacitance manometer produced by MKS Instruments, Inc. We utilized $CHF_3$ gas at a flow rate of 12 cc/min into the chamber for etching the fused-silica. The diffusion pump was throttled to maintain a constant chamber pressure of 10 millitorr and the cold trap was not cooled. The rf power density was held to 0.3 watts/$cm^2$ to provide predominantly chemical etching by the reactive species generated in the ionized $CHF_3$ gas and to minimize substrate heating. These conditions allowed the use of photoresist as a mask material. Prior to etching, the system was pumped down to the $10^{-6}$ Torr range and held there for 30 minutes. $CHF_3$ gas was then introduced and the throttle valve was adjusted to maintain a 10 millitorr chamber pressure. The system was flushed with $CHF_3$ in this manner for 10–15 minutes before the application of power. Rf power was then applied and the rf tuning network adjusted for minimum reflected power. We note that after the first few minutes of operation the cathode bias dropped from $-500$ volts to $-400$ volts, which bias remained stable thereafter. This phenomenon is believed to be caused by either contamination introduced during the initial startup or plasma polymerization on the cathode surface during the first few minutes of etching. We utilized commercial TO-8 fused silica substrates. All samples were thoroughly cleaned. The samples using photoresist as a mask material had a 1.5 $\mu$m layer of spincoated Shipley 1350J photoresist. The photoresist patterns were exposed by an unfiltered mercury lamp with a conformable chrome mask in vacuum contact. The exposed and developed samples were prebaked at 80° C. in dry nitrogen for 1 hour prior to reactive ion etching. Samples using chromium etched masks were prepared with conformable chrome masks utilizing lift-off techniques. FIG. 4 shows the results produced on a substrate mounted in box 5 at 45° to the surface of grid 1. The sample had a 1000Å thick chromium mask grating having linewidths of 3 μm and was etched for 90 minutes.

In any sputtering process redeposition of the substrate material is a serious problem. With reactive ion etching redeposition of the substrate material does not occur because the reactants are volatilized due to the chemical nature of the etching process. However, we have observed redeposition of stainless steel which was sputtered from the cathode box onto the substrates. The elimination of cathode material sputtering required that all exposed surfaces on the cathode box in the line of fire of the plasma be covered with $SiO_2$ or any material which is not reactively volatile in the $CHF_3$ plasma.

In other embodiments of the present invention wall 10 was a grid and not a solid wall as is shown in FIG. 3. This has the advantage of allowing visual inspection of the etching while having the disadvantage of allowing some side etching due to horizontal ion bombardment through this viewing screen. The side etching may be eliminated by utilizing a solid wall, as is shown in FIG. 3, or by using a glass wall surrounding, inside or out, a grid.

The striations visible in FIG. 4 are the best indication of the high degree of ion collimation which still exists behind the grid structure and are due to mask edge roughness. In fact we have found that the anisotropic etching properties associated with reactive ion etching are preserved with the grid structure. We did observe that the use of a photoresist mask, e.g. AZ 1350, is undesirable for angled etching behind the grid due to possible sputter redeposition as well as the problem of shadowing by the thick masking layer. This seems to indicate that etching an oblique angle requires a thin mask such as Cr, etc., to obtain pattern replication.

Although the use of the grid structure between the substrate and the plasma does not destroy ion collimation, the etch rates are reduced somewhat from those found in the conventional apparatus. For example, RIE utilizing $CHF_3$ on $SiO_2$ has an etch rate which is reduced by about 30 percent with the grid of FIG. 3. For purely physical sputtering with Ar or Au we also find an etch rate reduction of 30 percent, which turns out to be roughly equal to the percentage of area blocked by the grid wires.

The etch uniformity appears to be slightly perturbed by the existence of the stainless-steel grid, which is shadowed onto the substrates by the highly collimated ion beam. Although visible to the eye, the image of the fine wire grid is sufficiently defocused that we have not been able to measure any perceptible change in the etch depth across the substrates, at least to an accuracy of ±5%. Thus we do not believe the uniformity problem imposed by the grid is severe. Angling the one inch square substrates used in the experiments results in vastly different distances that the ions have to travel to reach the etching surface. Nevertheless, very good etch depth uniformity has been observed in these cases, indicating again that the ion beam does not change its properties once in the cathode cage.

Lastly, we note that it is often desirable to rotate, translate, or otherwise manipulate the substrates during etching to improve uniformity, tailor the etch wall profile, or remove wall striations. For example, the striations observed in the side walls shown in FIG. 4 may be removed by placing the substrate 2 on a holder which is rotatable about an axis in the plane of FIG. 3 and parallel to grid 1. Rod 12 shown in FIG. 3 is used for manipulating the substrate angle or position.

What is claimed is:

1. Apparatus for etching a substrate (2) which comprises:
    anode means (6) disposed parallel to cathode means (5) in a chamber (110);
    means (106) for introducing a gaseous etchant between said anode and said cathode means in said chamber;
    means (102) for applying an rf voltage between said anode and said cathode means;
    characterized in that:
    said cathode means comprises grid means (1) and an equipotential enclosure (8, 9 and 10), and means for supporting said substrate in said enclosure below said grid at an oblique angle to said grid, whereby said substrate may be etched.

2. Apparatus as defined in claim 1 which further includes means (12) for adjusting the orientation of said substrate during etching.

3. Apparatus as defined in claim 1 which further includes a layer (11) of material which is not susceptible to etching by said etchant, which layer of material covers the surface of said enclosure facing said anode means.

4. Apparatus as defined in claims 2 or 3 wherein the side walls (10) of said enclosure are stainless steel.

5. Apparatus as defined in claims 2 or 3 wherein the side walls (10) of said enclosure comprise a wire grid and a glass wall.

* * * * *